United States Patent [19]

Ogiwara

[11] Patent Number: 5,124,628
[45] Date of Patent: Jun. 23, 1992

[54] GATE PULSE GENERATOR OF A REACTIVE POWER COMPENSATION DEVICE

[75] Inventor: Hideshi Ogiwara, Tokyo, Japan

[73] Assignee: Kabushiki Kaisha Toshiba, Kawasaki, Japan

[21] Appl. No.: 683,811

[22] Filed: Apr. 11, 1991

[30] Foreign Application Priority Data

Apr. 12, 1990 [JP] Japan ................................. 2-95153

[51] Int. Cl.$^5$ .............................................. G05F 1/70
[52] U.S. Cl. .................................... 323/211; 363/56
[58] Field of Search ............... 323/208, 209, 210, 211; 363/56

[56] References Cited

U.S. PATENT DOCUMENTS

| | | | |
|---|---|---|---|
| 4,633,381 | 12/1986 | Upadhyay | 363/56 |
| 4,641,231 | 2/1987 | Walker et al. | 363/56 |
| 4,829,415 | 5/1989 | Haferl | 363/56 |
| 4,859,884 | 8/1989 | Yoshino | 323/210 |

OTHER PUBLICATIONS

IEE-pp. 183-188 "Thyristor Switched Capacitor, TSC, in Theory and Practice"1 1985, ASEA AB, Sweden.

Primary Examiner—Peter S. Wong
Attorney, Agent, or Firm—Oblon, Spivak, McClelland, Maier & Neustadt

[57] ABSTRACT

A gate pulse generator for a reactive power compensation device in which a capacitor is connected in series with antiparallel connected thyristors and which is so constructed that triggering pulses are produced and current is passed into said capacitor when both a signal of forward voltage imposed on said thyristors and a thyristor conduction period signal that is reset by a phase control signal are present. The gate pulse generator includes a means by which conduction period signals associated with thyristors of one polarity are reset during conduction if both a triggering pulse of thyristors of the opposite polarity and a delayed phase control signal associated with the opposite polarity thyristor is present.

3 Claims, 9 Drawing Sheets

GATE PULSE GENERATOR OF A REACTIVE POWER COMPENSATION DEVICE

BACKGROUND OF THE INVENTION

1. Field of the Invention

The present invention relates to a reactive power compensation device, and more particularly to a thyristor switch gate pulse generator for capacitor load switching in a reactive power compensation device.

2. Discussion of the Background

In the past, the main demand for reactive power compensation devices has been for flicker control of arc furnaces and rolling mills, but in recent years there has also been interest in their applications for changing power system voltages and power surge control, etc. and they are also coming into increased use in transformer substation filter phase advancing equipment. Such equipment uses a combination of TCRs (thyristor controlled reactors) for which normally reactor current is controlled by thyristors or thyristor switches (thyristor switched capacitors; referred to below as TSCs) which have thyristor converters connected in series to capacitors and reactors.

Increases in the voltage and capacity of such equipment have involved the use of TCRs constituted by series connections of large numbers of thyristors. Since the load of a TSC is a capacitor, it functions as an on-off switch and a gate pulse generator that switches the thyristors on and off must be able to switch a large number of thyristors on and off all together at high speed.

The prior art will now be described with reference to FIGS. 3, 4, 5, 6A and 6B.

FIG. 3 is a block diagram of a typical TSC. A capacitor 2, a reactor 4 and a thyristor converter 8 constituted by a gate pulse generator 6 which produces gate pulse signals for thyristors 3U and 3X in response to on-off commands from a control unit 7 are connected in series to a TSC transformer 1.

Reference numeral 5 designates a circuit for detection of thyristor switch 3U and 3X voltage.

FIG. 4 shows the waveforms during normal operation of the various sections of the TSC shown in FIG. 3. VS is the primary voltage of the TSC transformer and IC and VC are the current and voltage of the capacitor constituting the load of the thyristor converter.

PHS indicates phase control signals (referred to below as PHS) which are output by control unit 7 and are produced at the peak phase of power supply voltage VS to make the TSC converter excitation rush current minimum.

Mostly in recent years, a narrow gate pulse system has been employed for thyristor gate pulse generation. A narrow gate pulse system is one in which triggering signals in the form of one-shot pulses are supplied to thyristors at thyristor triggering times and compared to a conventional broad pulse system. It has the advantage that it is possible to make the power supply circuit of the gate pulse generator smaller and cheaper, etc.

FIG. 5 shows a gate pulse generator in a narrow gate pulse system. Reference numerals 8U and 8X designate flip-flop circuits, 9U and 9X AND gates, 10U and 10X one-shot circuits that output set pulse widths, 11U and 11X OR gates, 12 a one-shot circuit, 13 an AND gate, 14 a time delay circuit that outputs a signal after a set delay, 15 an AND gate and 16 a time delay circuit.

Flip-flop circuit 8U is set by a PHS(U) pulse output by the control circuit 7. A gate pulse signal GP(U) (referred to as GP below) of set width is output by one-shot circuit 10U and supplied to a gate of a thyristor switch only when the logical product of the forward voltage signal FV(U) of thyristor 3U and the Q output of flip flop 8U at AND gate 9U is "1".

Flip-flop circuit 8U that has been set by a PHS(U) pulse is reset by the logical sum output of OR gate 11U.

For one input of OR gate 11U, while one-shot circuit 12 is outputting a set pulse width after output of a gate pulse signal GP(X) of opposite-phase thyristor 3X, the logical product taken by AND gate 13 shows that both the forward voltage signal FV(U) of thyristor switch 3U and the F signal FV(X) of thyristor switch 3X (a reverse voltage signal with respect to reactor 4 of thyristor switch 3U) are "0" and this logical product becomes "1" only when time delay circuit 14 causes continuation for more than a set time.

In other words, the output of time delay circuit 14 becomes "1" only if a state in which both the forward voltage signal FV(U) and the reverse voltage signal FV(X) are not present in a set time after supply of a gate pulse signal GP(X) to opposite-phase thyristor switch 3X has continued for more than the thyristor turn-off time.

Output signals of time delay circuit 16 are supplied to the other input of OR gate 11U.

The logical product of GB signals (system stop signals) and reverse voltage signals FV(X) is taken at AND gate 15 and the output of this logical product becomes "1" only after time delay circuit 16 has caused continuation for more than a set time.

In other words, the output of time delay circuit 16 becomes "1" when a reverse voltage is imposed for more than the turn-off time after stopping.

Gate pulses GP(U) are output while setting of flip-flop circuit 8U by PHS(U) pulses and resetting of 8U by the two types of signals described above are alternately repeated.

Generally speaking, there are no problems with the above-described gate pulse generator resetting method as long as there is no need to consider external factors such as system voltage surges, etc. but since in actual fact external factors too must be taken into consideration, a problem as explained in relation to FIGS. 6A, 6B and 6C occurs.

FIG. 6A is a waveform timing diagram showing waveforms during the TSC operation, and particularly illustrates the TSC converter 1 secondary side voltage VS, capacitor current and voltage IC and VC, the voltage $V_{A-K}$ across opposite electrodes of thyristor switch 3U and the forward side and reverse side gate pulse signals GP(U) and GP(X). The waveforms of FIG. 6A are representative of normal operation of the circuit shown in FIG. 5.

FIG. 6B illustrates operation of the circuit shown in FIG. 5 in the case where an intermittence of current occurs. In particular, the particular waveforms shown in FIG. 6B illustrate the case where the capacitor current IC is made intermittent by a system voltage surge. When the capacitor current is intermittent, the AND condition of 9U (or 9X) is established and GPs of both phases are output out of synchronism with the PHS signals and protection against partial commutation failure of thyristor switches 3U and 3X is effected. If, subsequently, the intermittency of the current comes to an end and there is a move to normal conduction, the conditions for the resetting circuits of flip-flops 8U and 8X are established and so the flip-flops of both phases are reset.

In FIG. 6B, when U phase conduction ends and there is a move to X phase conduction, the current is intermittent and after a set time both the flip-flops are reset.

Action by the resetting circuit of flip-flop 8U is a correct action but since flip-flop 8X is reset soon after own-phase conduction starts, GP output becomes impossible even if the current is intermittent when X phase conduction ends and therefore partial commutation failure is caused and one can anticipate breakdown of thyristor elements.

Next described in more detail in relation to the waveform shown in FIG. 6B is a mechanism by which partial commutation failure occurs. In FIG. 6B, two intermittences occur at t2 and t7. Flip-flop 8X is reset at time t5, which is delayed from t2 by the delay time Td. The prior art circuit shown in FIG. 5 has the problem that if a second intermittence occurs at t7 and terminates at t8, GP(X) cannot be generated. GP(X) can be generated when the state of F.F.(U) is "1". As the state of F.F.(U) is "0" at t8 (see FIG. 6B), GP(X) cannot be generated at t8. The thyristor 3X is turned off at t7 because the reverse voltage is applied to the thyristor 3X. The forward voltage is applied to the thyristor 3X at t8, and some elements of the thyristor 3X may turn on and other elements may not turn on. A partial commutation failure may occur due to differences in the characteristics of the thyristor elements when the forward voltage is applied to the thyristor before the turn-off time. Partial commutation failure occurs in the absence of GP(X) due to the characteristics of thyristors connected in series. In series connection, there is a dispersion in turn-off time of the series connected thyristors. Each thyristor has its own turn-off time. In general, if a positive voltage is applied to a thyristor in a short time after turn-off, the thyristor turns on in the absence of a gate pulse. If the positive voltage is applied at the point after "turn-off time", the thyristors do not turn on in the absence of a gate pulse.

For example, if the time of applying a negative voltage T has the value as defined by the following relationship, partial commutation failure occurs:

$$T_{min} < T < T_{max},$$

where Tmin refers to the minimum turn-off time of the thyristors and Tmax refers to the maximum turn-off time of the thyristors. In this case, some elements are turned on and the other elements are maintained in the off condition, which results in a partial commutation failure condition. If a small number of thyristors, such as, only one thyristor is in the off condition, the total voltage is then applied to that one thyristor thereby destroying that thyristor.

In the circuit of FIG. 5, the delay time Td of the delay timer 14 is set so that Td is greater than the turn-off time of the thyristor. F.F.(U) is reset at t6 by GP(U) after a time delay Td after t2.

The possibility of partial commutation failure in the conventional circuit of FIG. 5 is a very great drawback from the point of view of providing a highly reliable reactive power compensation device.

SUMMARY OF THE INVENTION

Accordingly, one object of this invention is to provide a novel gate generator for a reactive power compensation device which during TSC operation confirms that a satisfactory turn-off time has been ensured and makes it possible to reset only the flip-flop circuits of phases which it is all right to reset and which, by outputting GPs prior to this, forcibly retriggers thyristor elements and so prevents partial commutation failure and breakdown of the thyristor elements.

Another object of this invention is to provide a new and improved gate pulse generator as above described, which distinguishes between correctly timed gate pulses and phase voltages (versus intermittences) and gate pulses that are out of synchronism, and which avoids resetting the GP flip-flop of FIG. 5 if the gate pulses are not correctly timed.

These and other objects are achieved according to the present invention by providing a new and improved gate pulse generator in a reactive power compensation device in which a capacitor is connected in series with thyristors that are connected in antiparallel and which is so devised that triggering pulses are produced and current is passed into the capacitor when both a signal of forward voltage imposed on the thyristors and a thyristor conduction period signal that is reset by a phase control signal are present, including means for resetting conduction period signals during conduction if both an inverted pair phase phase-control signal and a triggering pulse are present after a set time.

Thus, the gate pulse generator of the present invention includes a circuit which, on condition that there is present an own-phase gate pulse that has been emitted within a set time after input of a voltage (PHS) signal from a control unit, resets the flip-flop of the opposite phase. Due to the addition of this circuit, upon the following output of an opposite-phase gate pulse (GP), even if the conventional resetting condition occurs wherein there is an absence both of a GV(U) signal and of an FV(X) signal for more than a set time, flip-flop resetting is effected only if the opposite-phase GP is correctly timed. Thus, since resetting in response to GPs that are out of synchronism with PHSs is eliminated, there is no resetting during own-phase conduction and it is possible to output gate pulses even if intermittent current flows at the end of own-phase conduction and so to prevent partial commutation failure and breakdown of thyristor elements.

BRIEF DESCRIPTION OF THE DRAWINGS

A more complete appreciation of the invention and many of the attendant advantages thereof will be readily obtained a the same becomes better understood by reference to the following detailed description when considered in connection with the accompanying drawings, wherein.

DESCRIPTION OF THE PREFERRED EMBODIMENTS

Figure 1:
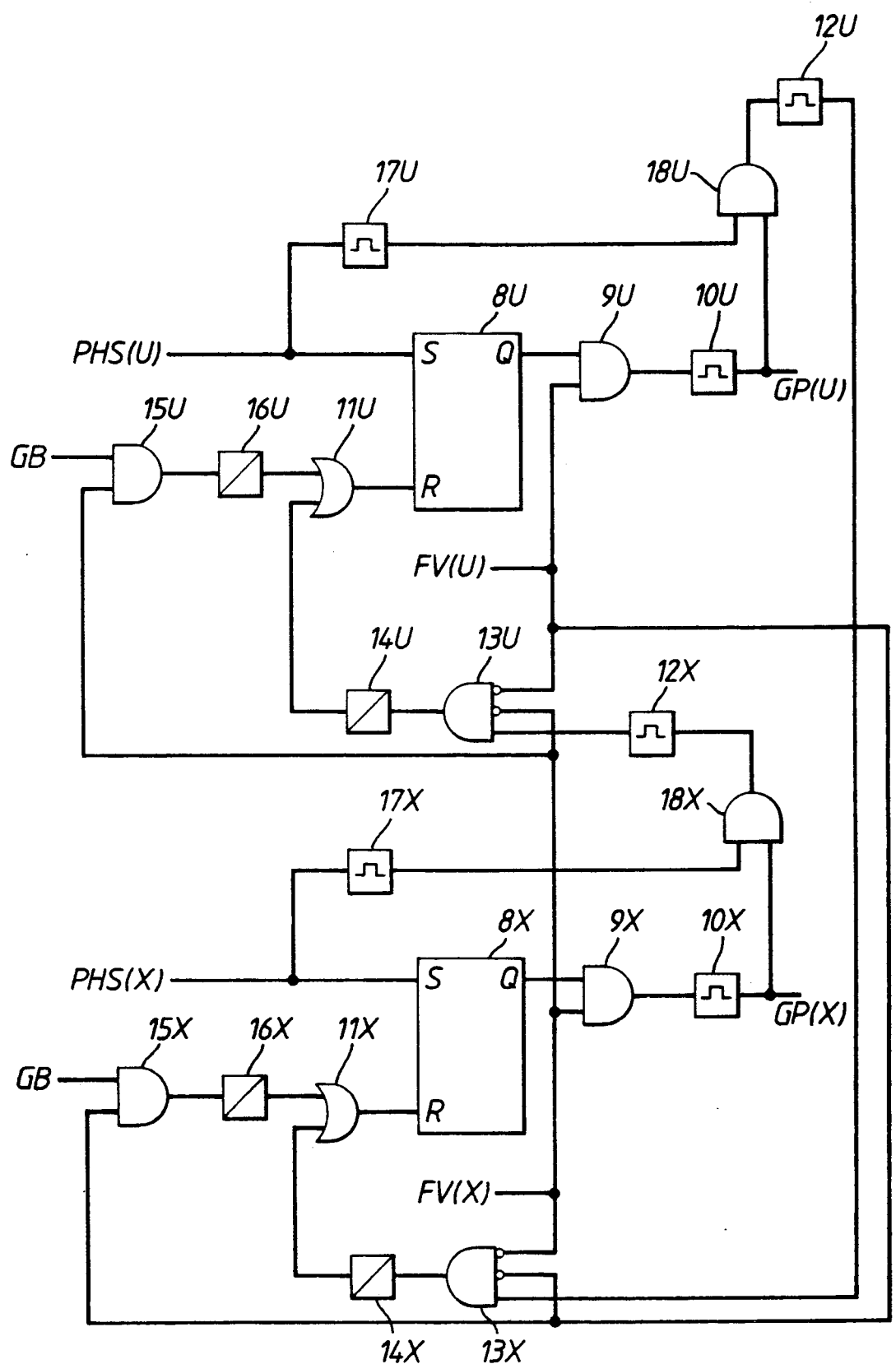
FIG. 1 is a block diagram of one embodiment of the gate pulse generation circuit of the present invention.
Figure 2A:
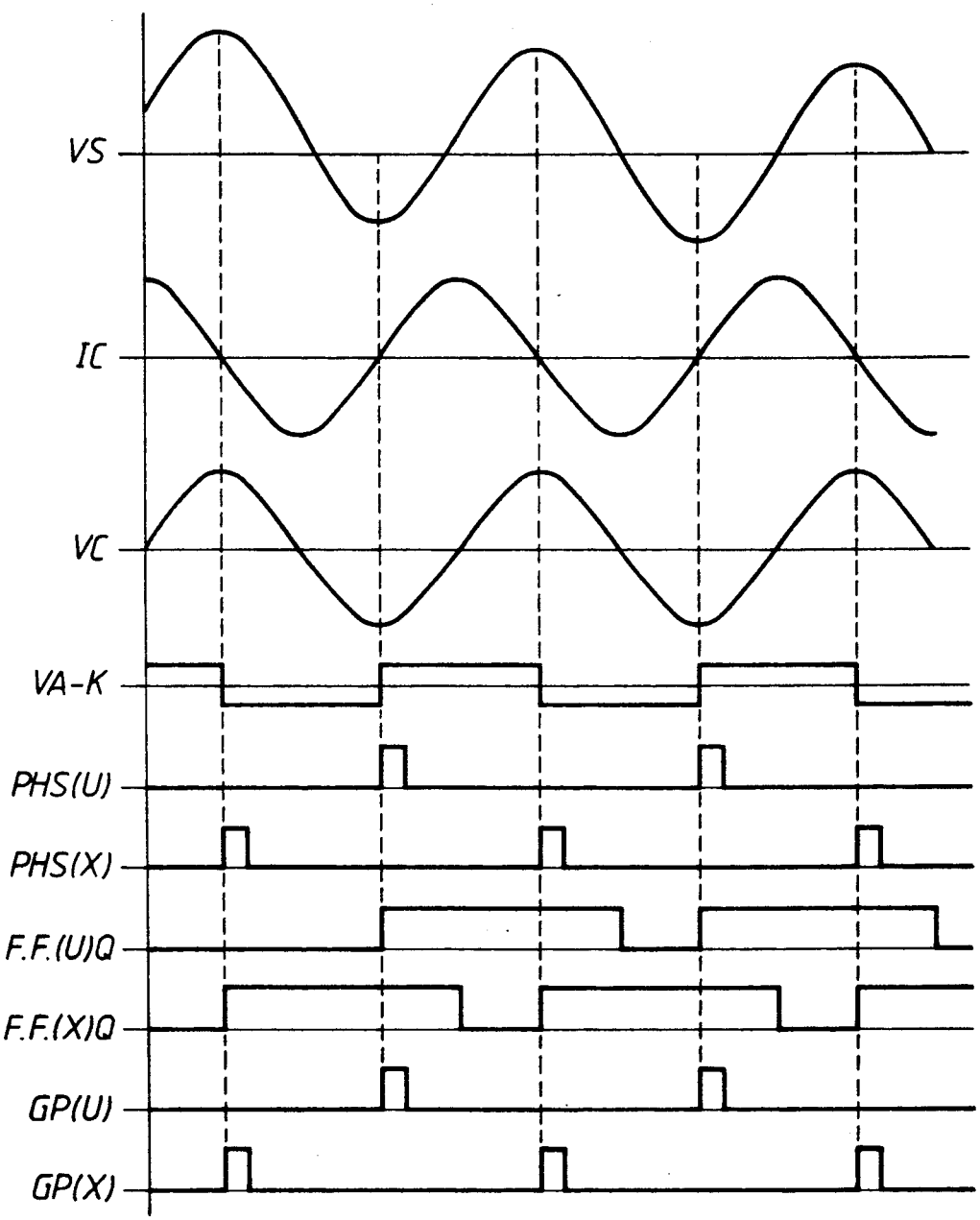
FIGS. 2A, 2B and 2C are waveform diagrams illustrating waveforms produced at various sections of a TSC by a gate pulse generation circuit of the present invention under various operating conditions.
Figure 2B:
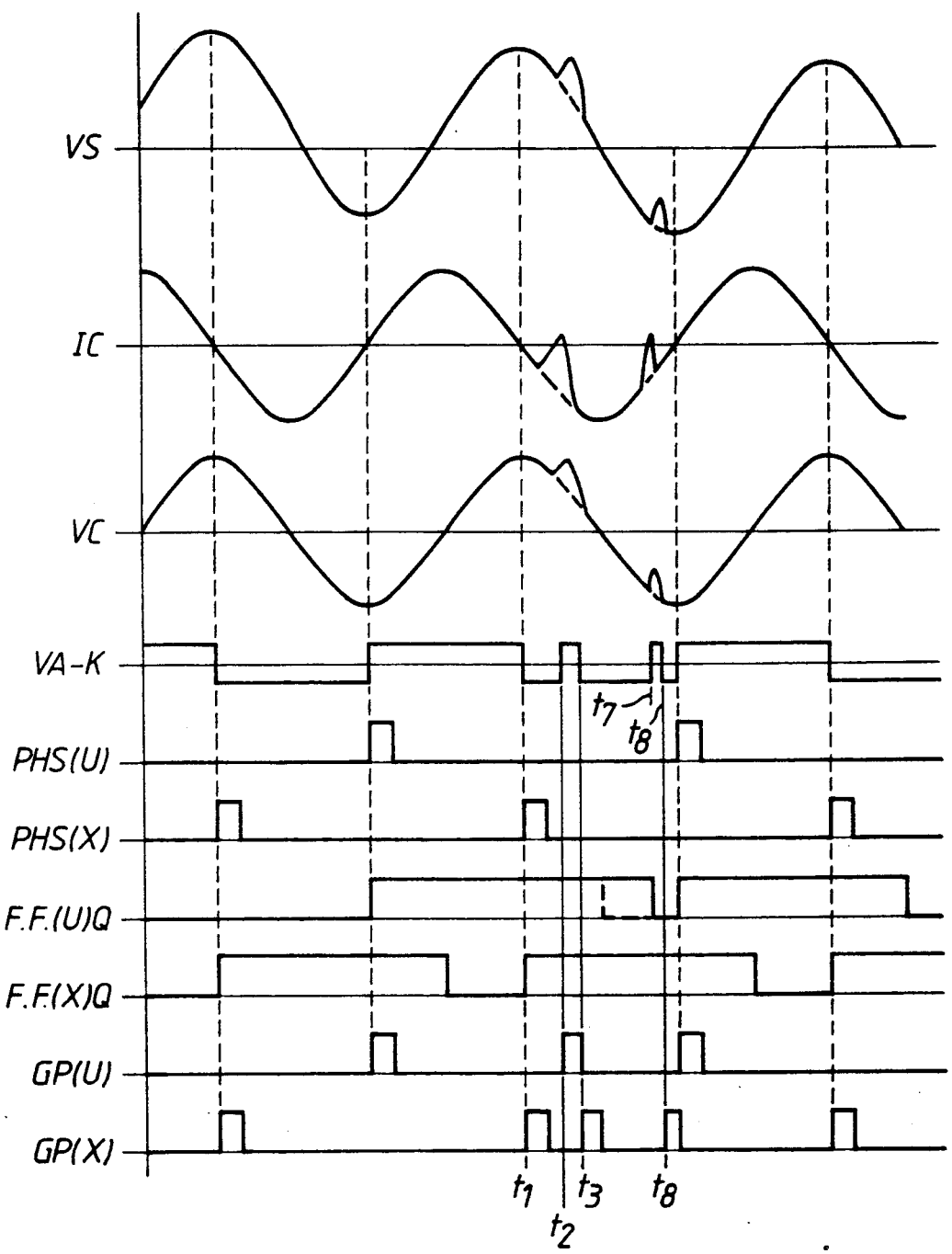
Figure 2C:
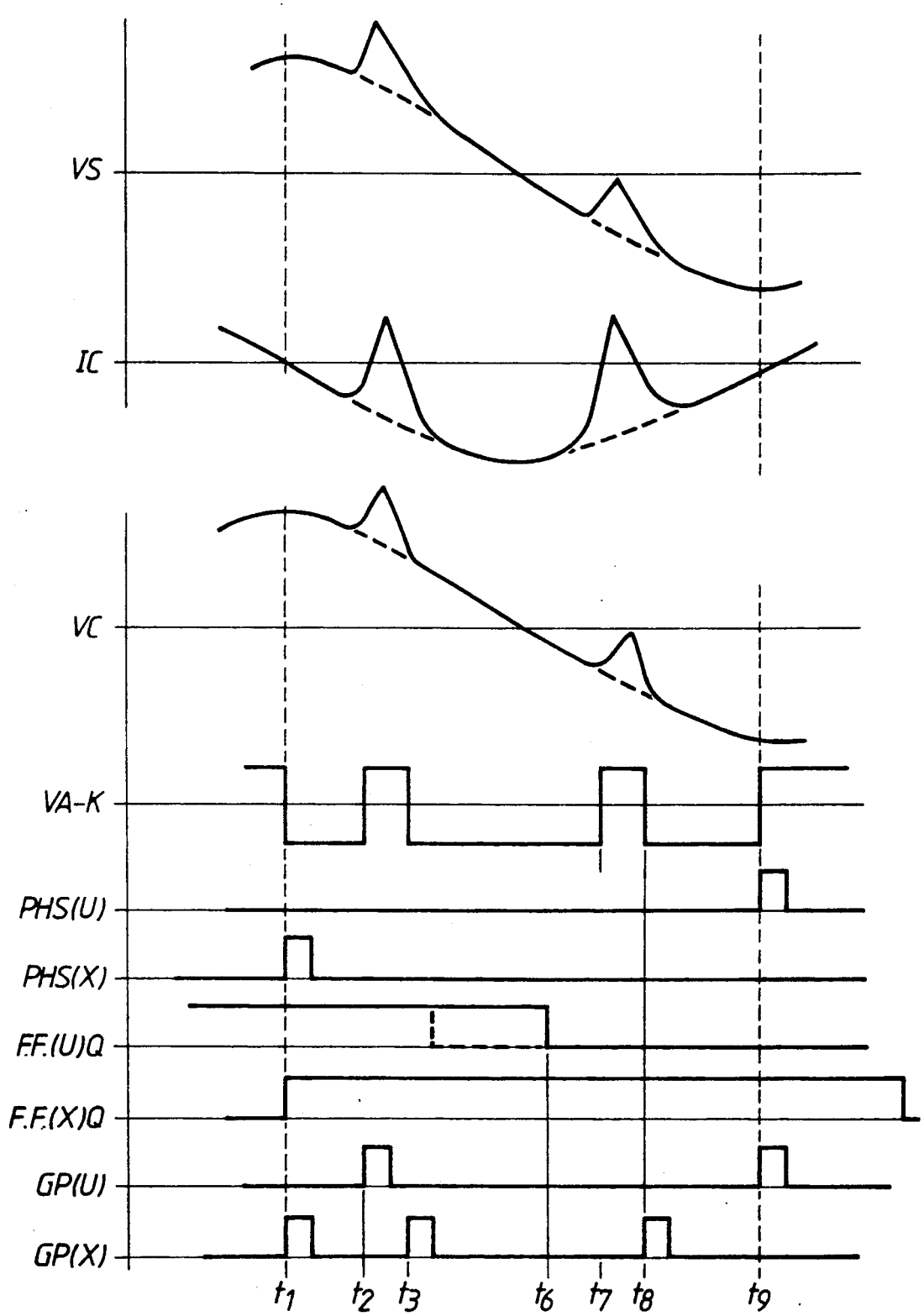
Figure 3:
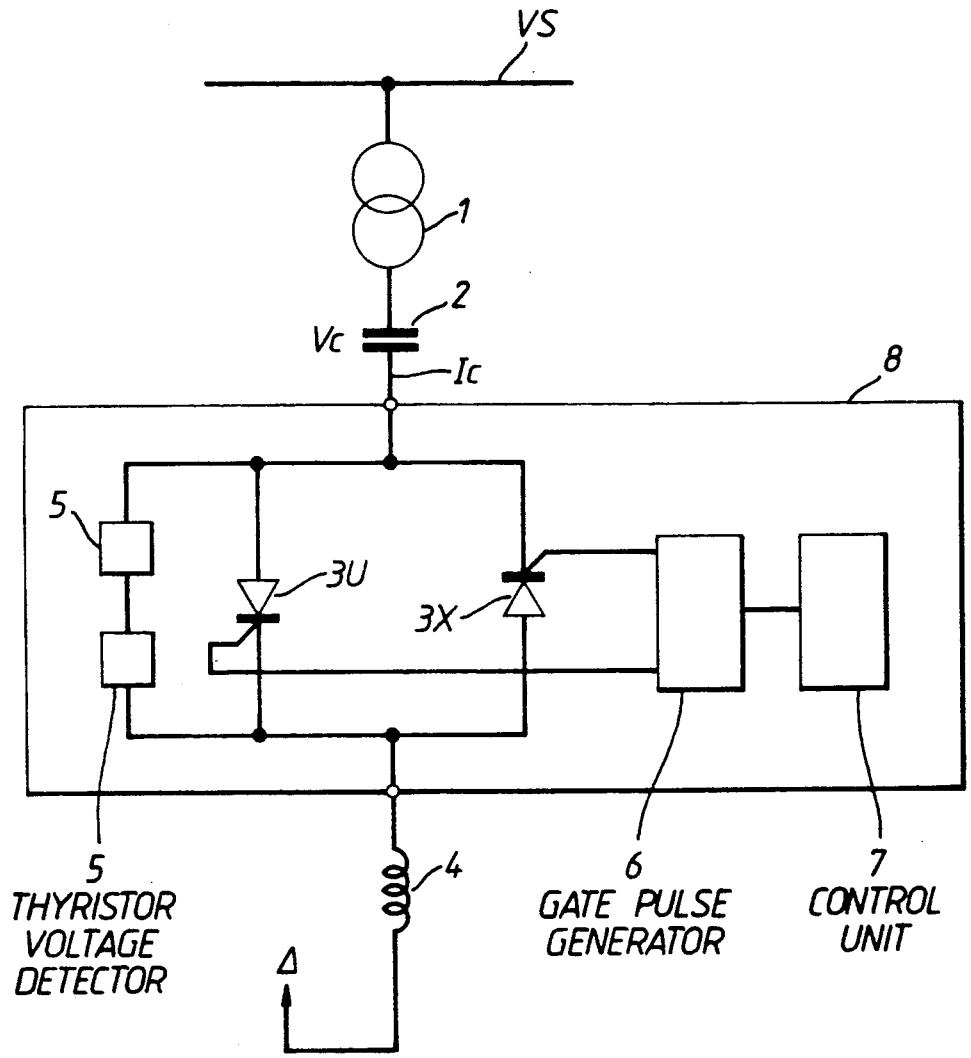
FIG. 3 is a circuit diagram of a typical TSC.
Figure 4:
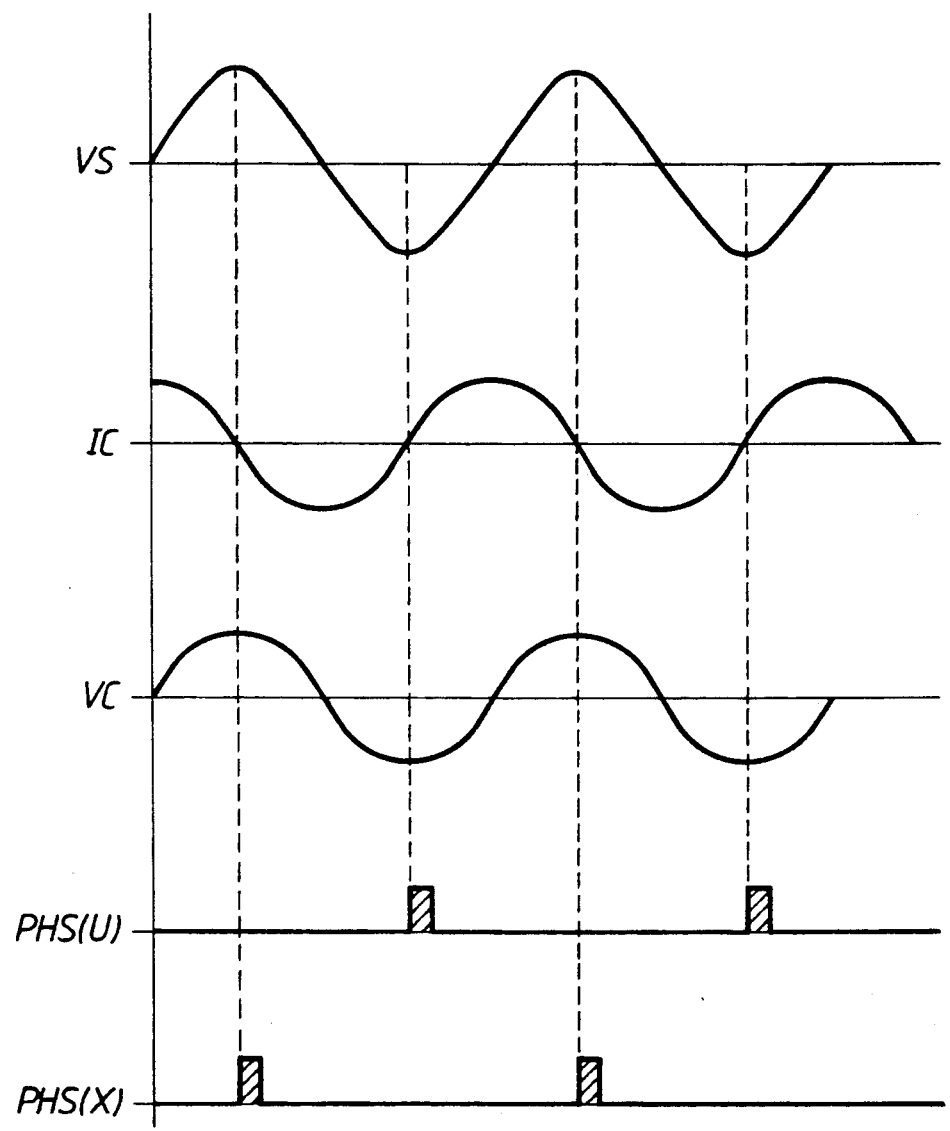
FIG. 4 is a waveform diagram of waveforms at different sections, of the TSC for giving an understanding the operation of the TSC.
Figure 5:
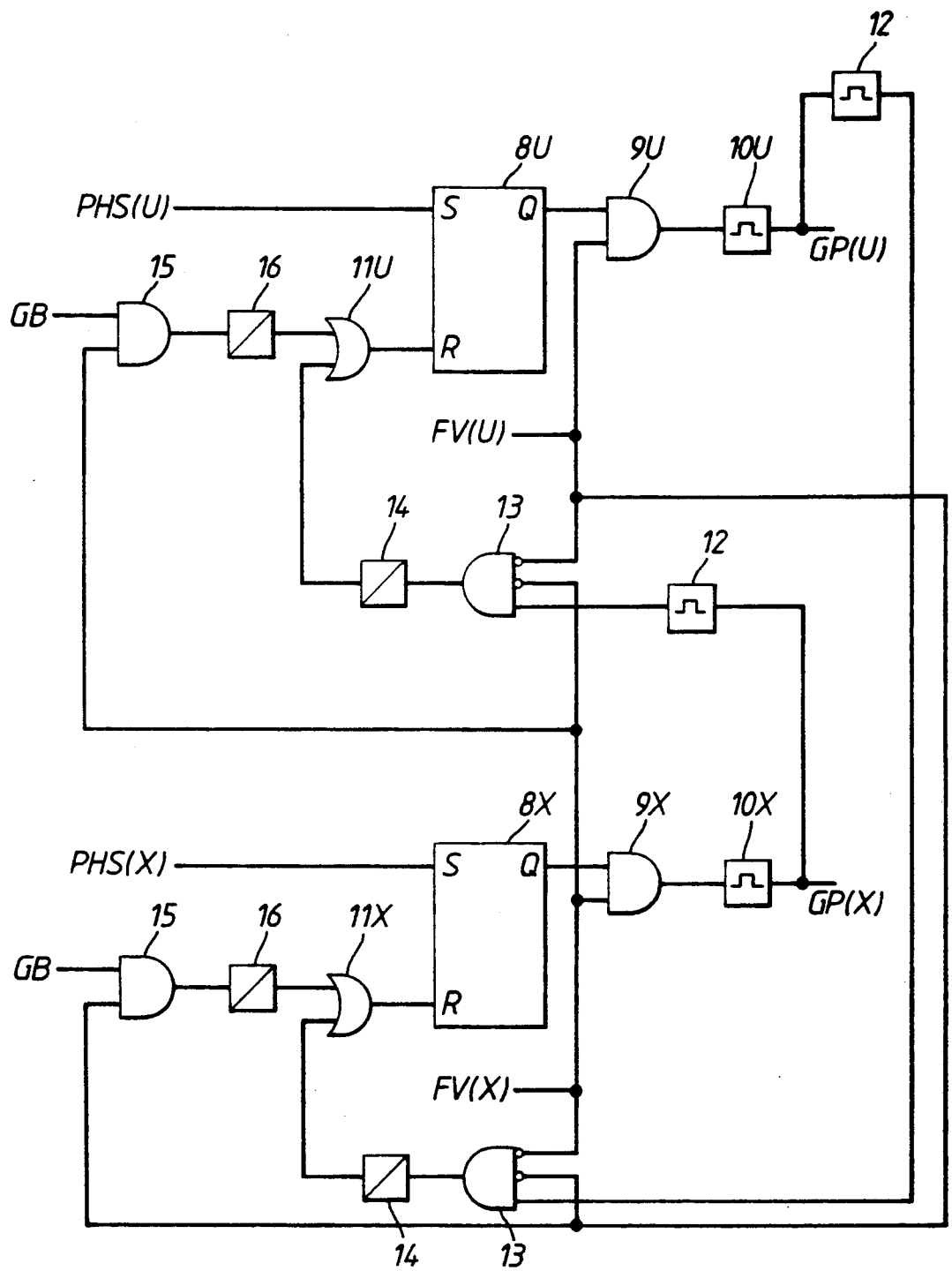
FIG. 5 is a block diagram of a conventional narrow gate pulse type gate pulse generation circuit.
Figure 6A:
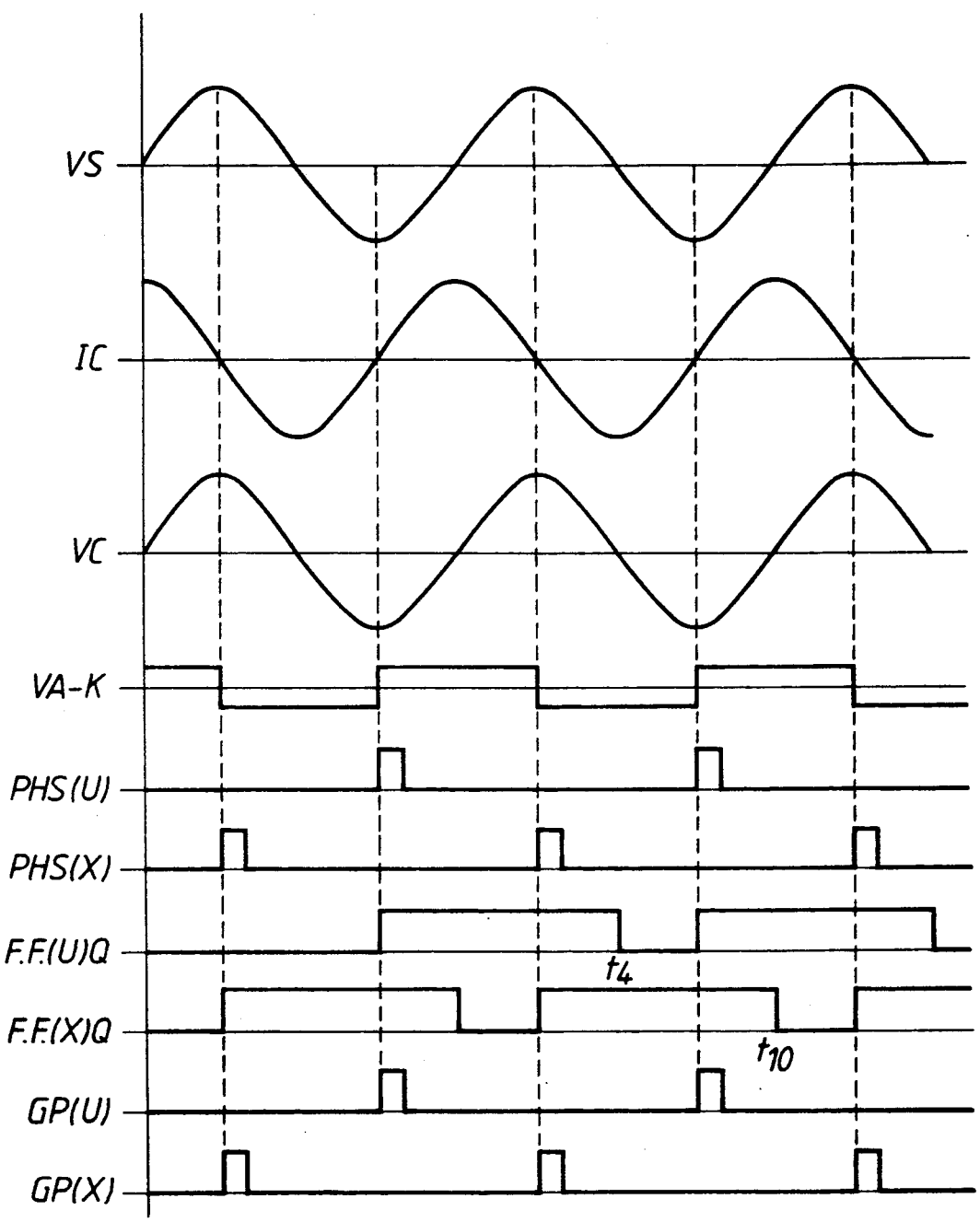
FIGS. 6A and 6B are waveform diagrams illustrating waveforms at various sections during various conditions of operation of the TSC driven by gate pulses produced by the circuit of FIG. 5.
Figure 6B:
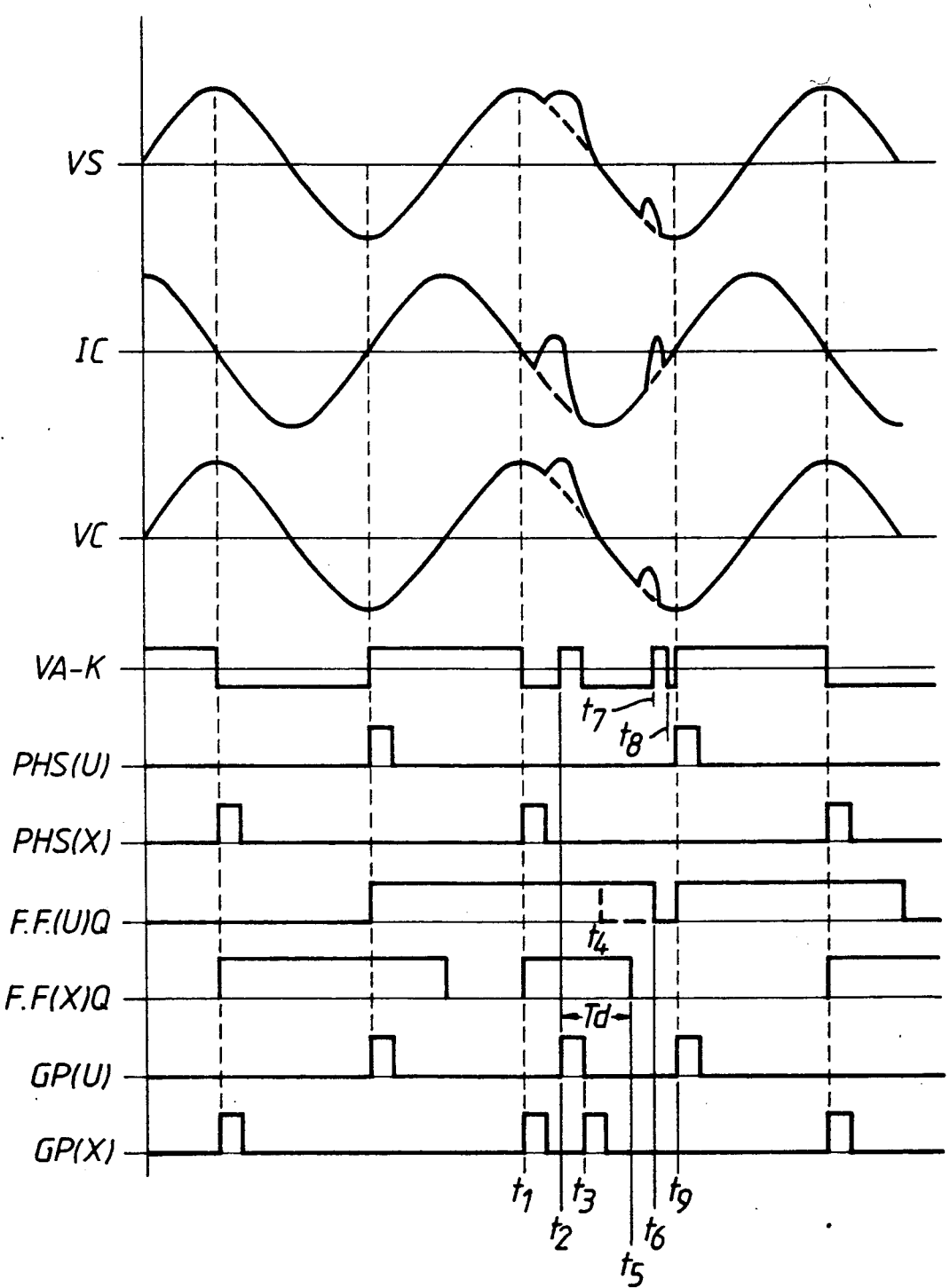

Referring now to the drawings, wherein like reference numerals designate identical or corresponding parts throughout the several views, and more particularly to FIGS. 1, 2A, 2B and 2C thereof, the gate pulse generator of the present invention includes essentially identical circuits for generating the U-phase gate pulses GP(U) and X-phase gate pulses GP(X). As is evident from FIG. 2A, during normal operation, signals PHS(U), FV(U), PHS(X), FV(X), and GB are applied to the gate pulse generator circuit. As with the conventional circuit shown in FIG. 5, signals PHS(U) and PHS(X) are produced by control circuit 7 at the maximum forward and reverse voltages of VS, respectively. The signal FV(X) is at a logic level "1" when the signal $V_{A-K}$ shown in FIGS. 2A-2C and 6A-6B is negative and a logic level "0" when the signal $V_{A-K}$ is positive. Signal FV(U) is positive when the signal $V_{A-K}$ is positive, and vice versa. The signal $V_{A-K}$ is the voltage across the anode and cathode of the thyristor 3U shown in FIG. 3. In FIGS. 2A-2C, the signal F.F.(U) is the Q output of the flip-flop 8U, whereas the signal F.F.(X) is the Q output of the flip-flop 8X. The signal GB is a system stop signal.

In FIG. 1, reference numeral designations 8U and 8X designate flip-flops, 9U, 9X designate AND gates, 10U, 10X designate one-shot circuits, 11U, 11X designate OR gates, 12U, 12X designate one-shot circuits, 13U, 13X designate AND gates, 14U, 14X designate time delay circuits, 15U, 15X designate AND gates, 16U, 16X designate time delay circuits, 17U, 17X designate one-shot circuits, and 18U, 18X designate AND gates. In relation to the conventional circuits shown in FIG. 5, the gate pulse generator of the present invention further includes the provision of one-shot circuit 17U and AND gate 18U for controlling generation of the reset pulse fed back to the flip-flop circuit 8X, and corresponding circuits 17X and 18X for controlling generation of a resetting pulse applied to the flip-flop 8U.

During operation, a PHS(X) signal causes the one-shot circuit 17X to output a one-shot pulse of set width and the logical product of this pulse and GP(X) is taken at the output of AND gate 18X. The output signal of AND gate 18X is applied to one-shot circuit 12X which produces a pulse applied to the AND gate 13U, which, if FV(U) and FV(X) are "0", after a time delay produced by time delay circuit 14U is applied via OR gate 11U to the reset terminal of flip-flop 8U. This chain of circuit elements forms a U phase flip-flop resetting circuit, whereas corresponding circuits for the X phase flip-flop 8X, above-identified, comprise an X phase flip-flop resetting circuit.

In the gate pulse generator circuit constituted as above-described and shown in FIG. 1, even if an intermittent current occurs because of a system voltage surge, etc., and gate pulses which are out of synchronism with the PHS(U) and PHS(X) signals of the two phases are output, flip-flop resetting of flip-flops 8U and 8X is effected only when correctly timed gate pulses GP(X) and GP(U) are output. It is therefore, according to the invention, possible to prevent the flip-flop resetting during own-phase conduction. Consequently, even if there is an intermittent current at the end of an own-phase conduction, gate pulses that are out of synchronism with the PHS(U) and PHS(X) signals can be output, and partial commutation failure and breakdown of thyristor elements can be prevented.

The effect of the present invention is illustrated with respect to the timing waveform shown in FIG. 2A-2C. FIG. 2A shows a normal operation of the circuit shown in FIG. 1. FIG. 2B shows the case where a current intermittence occurs. FIG. 2C is an enlarged view of a portion of FIG. 2B where a current intermittence occurs.

In FIG. 2C, current intermittences occur at t2 and t7. GP(U) is generated at t2, and GP(X) is generated at t3 due to the first intermittence. GP(U) cannot be generated at t7 because the flip-flop F.F.(U) (i.e., flip-flop 8U) is reset at t6. This presents no problem because none of the thyristor elements in the thyristor U may turn on. In this instance, the reverse voltage has been applied over enough time.

GP(X) can be generated at t8 because F.F.(U) has not yet reset at t8.

Consequently, even if there is an intermittent current at the end of own-phase conduction, gate pulses that are out of synchronism with the PHS signals can be output and partial commutation failure and breakdown of thyristor elements can be prevented.

Advantageously, the present invention causes no drawbacks, since the additional circuits which prevent partial commutation failure do not disturb the conventional reset circuits and functions typically performed. According to the present invention, own-phase flip-flop resetting is effected if a correctly timed opposite-phase gate pulse is output. Thus, in the present invention, even if a current is intermittent and gate pulses that are out of synchronism with the PHS signals in the two phases are output, since flip-flop resetting is effected only if gate pulses are correctly timed and even if the current is subsequently intermittent, it is possible to output gate pulses that are out of synchronism with the PHS signals. The present invention therefore makes it possible to provide a highly reliable static type reactive power compensation device in which thyristor elements are protected from partial commutation failure and breakdown.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the U.S. is:

1. In a reactive power device in which a capacitor is connected in series with antiparallel connected first and second thyristors, an improved gate pulse generator for applying gate pulse signals to said first and second thyristors, comprising:

first set means for setting a first thyristor conduction signal in response to a first phase control signal to generate a first gate pulse signal applied to said first thyristor when a forward voltage is applied across the anode and cathode of said first thyristor;

second set means for setting a second thyristor conduction signal in response to a second phase control signal to general a second gate pulse signal applied to said second thyristor when a forward voltage is applied across the anode and cathode of said second thyristor;

first reset means for resetting said first thyristor conduction signal only if a gate pulse signal applied to said second thyristor is present a predetermined time after a forward voltage is applied across the anode and cathode of said second thyristor; and second reset means for resetting said thyristor conduction signal of said second thyristor only if a gate pulse signal applied to said first thyristor is present a predetermined time after a forward voltage is applied across the anode and cathode of said first thyristor.

2. The gate pulse generator according to claim 1, wherein:

said first and second reset means each comprise a flip flop having a set input and a reset input;

said first reset means comprises a first one-shot circuit having an input coupled to said second phase control signal and an output, and a first AND gate having a first input coupled to the output of said first-one shot circuit, a second input coupled to said second gate pulse signal, and an output coupled to the reset input of the flip flop of said first set means; and said second reset means comprises a second one-shot circuit having an input coupled to said first phase control signal and an output, and a second AND gate having a first input coupled to the output of said second one-shot circuit, a second input coupled to said first gate pulse signal, and an output coupled to the reset input of said flip-flop of said second set means.

3. In a reactive power device in which a capacitor is connected in series with antiparallel connected first and second thyristors, an improved gate pulse generator for applying gate pulse signals to said first and second thyristors, comprising:

first set means for setting a first thyristor conduction period signal in response to a first phase control signal to generate a first gate pulse signal applied to said first thyristor when a forward voltage is applied across the anode and cathode of said first thyristor;

second set means for setting a second thyristor conduction period signal in response to a second phase control signal to generate a second gate pulse signal applied to said second thyristor when a forward voltage is applied across the anode and cathode of said second thyristor;

first reset means for resetting said first thyristor conduction period signal when said second gate pulse signal is applied to said second thyristor only if said second gate pulse signal is applied to said second thyristor in synchronization with said second phase control signal; and second reset means for resetting said second thyristor conduction period signal when said first gate pulse signal is applied to said first thyristor only if said first gate pulse signal is applied to said first thyristor in synchronization with said first phase control signal.

* * * * *